United States Patent [19]

Lee

[11] Patent Number: 5,534,850
[45] Date of Patent: Jul. 9, 1996

[54] TRANSIENT CONTROL CIRCUIT FOR OCCUPANCY DETECTOR

[75] Inventor: Wade Lee, Lafayette, Calif.

[73] Assignee: Larry C. Y. Lee, Hayward, Calif.

[21] Appl. No.: 271,886

[22] Filed: Jul. 7, 1994

[51] Int. Cl.$^6$ .................................................. G08B 13/00
[52] U.S. Cl. .......................... 340/565; 307/117; 340/567
[58] Field of Search ........................ 340/565–67, 529–30, 340/506, 309.15; 367/197; 307/117; 324/677; 250/342, 338.1; 315/119–120, 129

[56] References Cited

U.S. PATENT DOCUMENTS 4,344,071  8/1982  Allen ........................................ 340/566

*Primary Examiner*—Thomas Mullen
*Attorney, Agent, or Firm*—Elliot B. Aronson

[57] ABSTRACT

An electrical circuit for use in occupancy detectors for preventing false triggering when a load such as a light is de-energized. The occupancy detector includes circuitry for providing an intermediate signal indicating detection of a target object. An output stage receives the intermediate signal and in response provides a trigger signal for energizing the light or other load. An RC network, having a characteristic charge decay time, is coupled to the output stage such that the characteristic charge decay time governs the duration for which the output stage asserts the trigger signal for energizing the light or other load. Output signals from the occupancy-detecting circuitry are applied to the RC network through a first transistor switch. A second RC network, having its own characteristic charge decay time, is provided and the trigger signal is applied to charge the second RC network. When the output stage deasserts the trigger signal (thereby de-energizing the light or other load), the second RC network is discharged through a second transistor switch so as to bias the second transistor switch to its conducting state. The second transistor switch is connected to cut off the first transistor switch for the duration of the second RC network's characteristic charge decay time. During this period the first RC network is blocked from receiving the output of the occupancy-detecting circuitry, which is diverted instead over a bypass path through the second transistor switch.

6 Claims, 1 Drawing Sheet

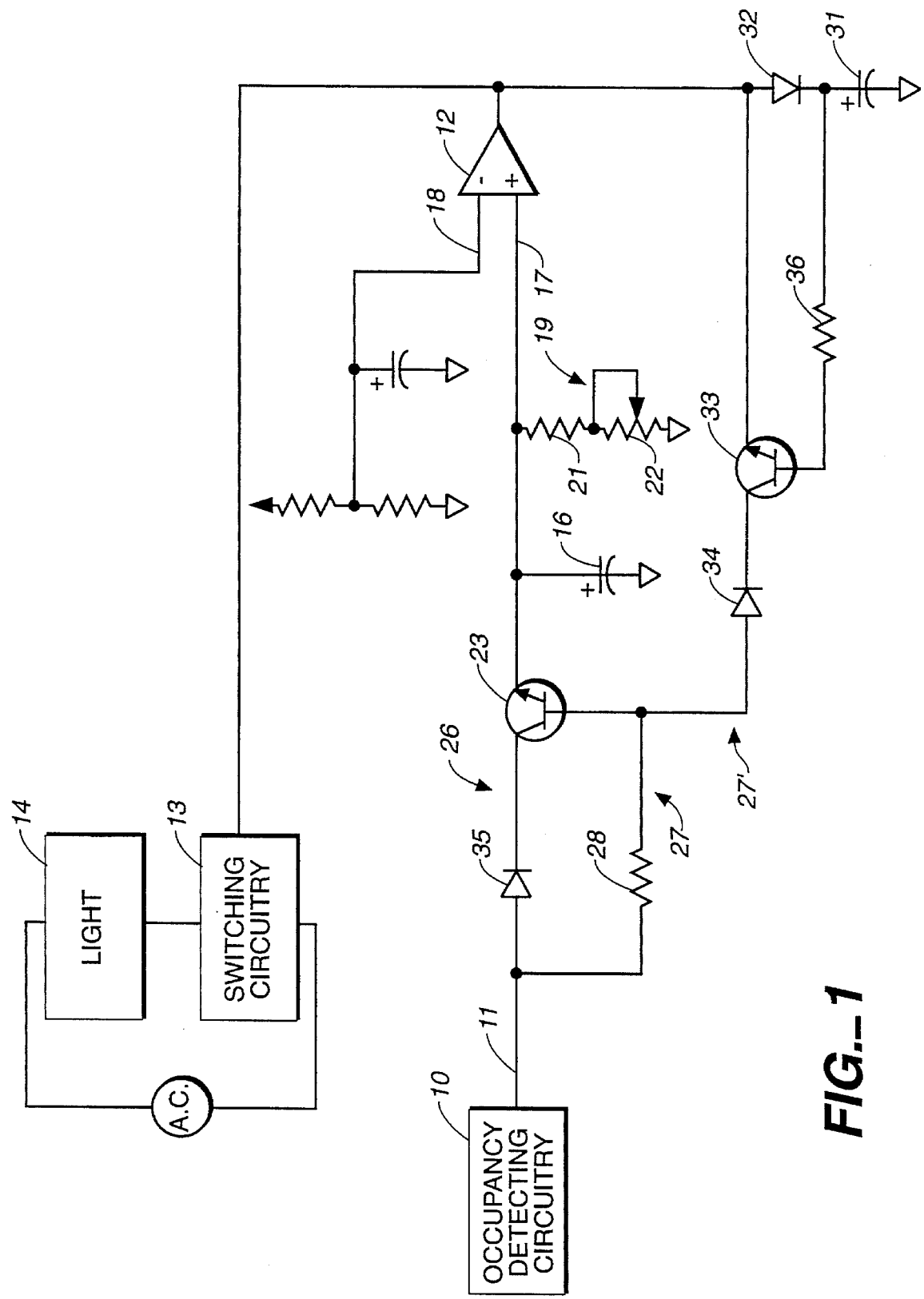
FIG._1

5,534,850

TRANSIENT CONTROL CIRCUIT FOR OCCUPANCY DETECTOR

BACKGROUND OF THE INVENTION

The present invention relates generally to control circuitry for occupancy detectors, and is more particularly directed to false triggering of occupancy detectors caused by transient signals.

An occupancy detector is a device used in automatic light switches and security systems to turn on a light or to activate some other form of alarm or warning indicator when a person or motor vehicle enters a monitored area. Such devices are used with outdoor residential lighting, for example, to illuminate a walkway as a person approaches the front door or to illuminate a driveway as a car approaches. They are also referred to as intrusion detectors, particularly in security applications.

A popular form of occupancy detector, for example, is the passive infrared (PIR) motion detector. The PIR motion detector functions by sensing heat in the form of infrared radiation emanating from a person or similarly warm object as the person or object enters or moves about in the field of view of the detector. When the motion detector detects an appropriate heat impulse characteristic of a moving heat source, it provides an electrical signal to activate the light or other alarm. For electric lighting it is common for the motion detector to keep the light on for a pre-set duration after motion has been detected. Thus, for example, when a person enters the motion detector's field of view, a light comes on and remains on typically for five, ten or fifteen minutes at the selection of the user. The light is then automatically extinguished at the end of the pre-set period unless further motion is detected.

A problem arises, however, when the light is extinguished. The sudden drop in electrical current through the light as the light is turned off can cause extraneous transient electrical noise signals in other parts of the motion detector circuitry. These transient noise signals sometimes trigger the motion detector to turn the lights back on again. The lights may also be re-triggered by infrared radiation from the lights themselves as they are extinguished. Typical lights require a few moments to cool down after being extinguished. When the lights cool through a certain temperature range, they emit an increased proportion of infrared radiation, which, depending on the disposition of the motion detector in its surroundings, may be picked up by the motion detector, either directly or through reflections. The motion detector may then interpret the transient infrared signal as an occupancy event and re-trigger the lights.

To counter these problems, motion detectors in the past have included timing circuitry for disabling the motion detector mechanism for several seconds as the lights are extinguished. During those several seconds the lights are fully extinguished and cool down and the extraneous noise signals dissipate. The motion detector then resumes scanning for further motion.

In the past, motion detectors have included specialized integrated-circuit timing chips or other complicated circuitry for momentarily disabling the motion detector or otherwise addressing the false triggering problem as the lights are extinguished. For low-cost PIR motion detectors the extra cost of the timing and disabling circuitry is significant and increases the price at which the motion detector may be offered to the end user.

SUMMARY OF THE INVENTION

The present invention provides a circuit arrangement for preventing false triggering of an occupancy detector as the lights are extinguished (or alternatively as some other load is de-energized) that uses a comparatively few low-cost circuit components and avoids the need for specialized timing chips or other more complicated circuitry.

An occupancy detector in which the present circuit arrangement may be utilized includes occupancy-detecting circuitry for detecting a target object in the field of view of the device. The occupancy-detecting circuitry provides an intermediate signal indicating detection of an object. An output stage receives the intermediate signal and in response provides a trigger signal for energizing the lights or other load. An RC network, having a characteristic charge decay time, is coupled to the output stage such that the characteristic charge decay time governs the duration for which the output stage asserts the trigger signal. That is, the characteristic charge decay time governs the duration for which the lights or other load are energized. Briefly, the present invention uses the following method to prevent false triggering of the occupancy detector as the lights are extinguished. Output signals from the occupancy-detecting circuitry, i.e., the intermediate signal and any transient signals that may be present, are applied to the above RC network through a first transistor switch. A second RC network, having its own characteristic charge decay time, is provided and the trigger signal is applied to charge the second RC network. When the output stage deasserts the trigger signal (thereby de-energizing the lights or other load), the second RC network is discharged through a second transistor switch so as to bias the second transistor switch to its conducting state. The second transistor switch is then applied to cut off the first transistor switch for the duration of the second RC network's characteristic charge decay time. During this period the first RC network is blocked from receiving the output of the occupancy-detecting circuitry, which is diverted instead over a bypass path through the second transistor switch.

A specific circuit embodiment for carrying out this method is described below. According to that embodiment the method may be implemented with as few as two transistors for the two transistor switches, two capacitors for the two RC networks, at least one diode, and several resistors, which represents a substantial decrease in the number and complexity of components employed in the prior art to provide protection from false triggering.

Other aspects, advantages, and novel features of the invention are described below or will be readily apparent to those skilled in the art from the following specifications and drawings of illustrative embodiments.

BRIEF DESCRIPTION OF THE DRAWINGS

FIG. 1 is an electrical schematic diagram showing a control circuit arrangement according to the invention.

DETAILED DESCRIPTION OF ILLUSTRATIVE EMBODIMENTS

FIG. 1 shows an occupancy detector circuit in block and circuit schematic form. Occupancy detecting circuitry shown generally at block 10 detects the presence of a target object in the field of view of the device and provides an intermediate signal on output line 11 indicating that an occupancy event has been detected. An occupancy detector will generally include an output stage that receives the intermediate signal and in response provides a trigger signal for triggering the lights or other load. In FIG. 1 the output stage is provided by amplifier 12, which provides a high signal at its output in response to the intermediate signal on line 11. The trigger signal at the output of amplifier 12 is applied to switching circuitry 13, which then applies the line voltage across the light 14 for energizing the light.

At this point it is beneficial to consider in more detail the nature of the problem addressed by the present invention. Occupancy detecting circuitry 10 typically includes one or more sensors that sense the presence of a target object. For example, the sensors may sense infrared radiation emanating from the target as in PIR motion detectors or sense sound levels or other indicators of an intrusion into the zone or zones monitored by the occupancy detector. The occupancy-detecting circuitry may even include several different sensors for independent verification that an occupancy event has taken place. Block 10 also typically includes signal processing circuitry for processing the raw signals from the sensors. The signal processing circuitry distinguishes or discriminates in some measure a characteristic of the signal expected from the desired target in the monitored area. For example, one popular type of PIR motion detector circuitry uses a thresholding approach for discriminating an occupancy event. The circuitry looks for a single pulse generated when heat from the target object impinges upon the PIR sensor and then seeks to discriminate against unwanted signals by responding only to pulses of a minimum threshold size. In this way the circuitry distinguishes pulses generated by weak incident infrared radiation, which is less likely to come from a human source or a motor vehicle. In any event, when the occupancy-detecting circuitry determines that an appropriate signal has been received, it provides an output signal on line 11 indicating that an occupancy event has taken place. Occupancy-detecting circuitry that employs the thresholding discrimination technique tends to be more susceptible to the false triggering noise problem addressed by the present invention in part because the sudden drop in line current when the lights are extinguished can generate noise spikes in the thresholding circuitry exceeding the threshold level.

In FIG. 1 circuitry for overcoming this false triggering problem is interposed between occupancy-detecting circuitry 10 and switching circuitry 13. A first capacitor 16 is connected to the + input 17 of amplifier 12, a reference voltage being applied to the − input 18. Capacitor 16 is provided with a discharge path through resistive network 19, which in the embodiment of FIG. 1 comprises fixed resistor 21 in series with variable resistor 22. Capacitor 16 and resistive network 19 form a first RC network that has its own characteristic charge decay time governed by the time constant of the RC network. A fully charged capacitor 16 maintains + input 17 at a potential greater than the reference potential on − input 18, and amplifier 12 provides a high output signal. Amplifier 12 will continue to provide a high output signal as long as the charge on capacitor 16 maintains input 17 above input 18. The rate at which capacitor 16 discharges governs the duration for which amplifier 12 provides a high output. The characteristic charge decay time of the RC network 16 and 19 may be adjusted by adjusting variable resistor 22.

A first switching transistor 23 is interposed between capacitor 16 and output line 11. Transistor 23 is connected to output line 11 over two paths 26 and 27. Path 26 connects output line 11 to a conduction side of transistor 23, specifically to the collector of npn transistor 23 shown in FIG. 1, and path 27 applies an appropriate potential to the base of transistor 23 through resistor 28. A second capacitor 31 is connected through diode 32 between the output of amplifier 12 and ground so that the output signal from amplifier 12 is applied both to switching circuitry 13 and to capacitor 31. A second switching transistor 33 couples capacitor 31 to the second path 27 from output line 11.

In the illustrated embodiment the collector of switching transistor 33 is connected through diode 34 to the base of transistor 23 for biasing the transistor 23 and also for coupling transistor 33 to the second path 27.

In operation, when a pulse appears on line 11 indicative of an occupancy event, the pulse is applied to both paths 26 and 27. The pulse on path 27 turns on transistor 23, and the pulse on path 26 passes through transistor 23 to charge capacitor 16. This raises the voltage at the + input 17 of amplifier 12 to a level higher than the reference at the − input 18. Amplifier 12 then provides a high output, which causes switching circuitry 13 to energize light 14. The high output from amplifier 12 also causes capacitor 31 to charge through diode 32. Meanwhile, capacitor 16 discharges through resistive network 19.

When light 14 is to be extinguished (typically at a fixed interval after the last occupancy event was detected, the interval being determined by the characteristic charge decay time of RC network 16, 19), the output of amplifier 12 goes low, which causes switching circuitry 13 to disengage light 14. Capacitor 31 is prevented from discharging through amplifier 12 by diode 32 and instead discharges through the base of transistor 33. At this stage transistor 33 is conducting and thereby causes a potential to be applied to the base of transistor 23 cutting off transistor 23. A false output on line 11 from a transient generated in the occupancy-detecting circuitry as light 14 is extinguished will be diverted along bypass path 27 and 27' through transistor 33 instead of charging capacitor 16 through transistor 23. Thus, the false output on line 11 will not result in a high pulse at the output of amplifier 12. Diode 34 is introduced to prevent the base current from transistor 33 from leaking up and charging capacitor 16. Diode 35 adds a voltage drop to path 26 balancing the voltage drop added to path 27, 27' by diode 34. Capacitor 31 and resistor 36 form a second RC network, having its own characteristic charge decay time that governs the duration for which transistor 33 is conducting and hence the duration for which capacitor 16 is prevented from charging. After capacitor 31 discharges below a predetermined level, transistor 33 shuts off and the bypass path from output line 11 is blocked. By this time any transients from extinguishing light 14 will have passed, and a new intermediate signal on output line 11 will be permitted to turn on transistor 23 and produce a high signal at the output of amplifier 12 as described above.

A notable advantage of the present circuit arrangement over the prior art is the great savings in cost that are achieved because the circuit may be implemented, as in the embodiment of FIG. 1, with only two transistors 23 and 33, two capacitors 16 and 31, resistors 21, 22, 28 and 36, and at least one diode 32, although diodes 34 and 35 are desirable for more stable operation. This avoids the need for more costly integrated circuit chips and associated discrete circuit components generally needed for proper biasing. The specific component values for the various resistors, capacitors, transistors and other components shown in FIG. 1 depend on the particular application and intended operating environment. Determination of appropriate component values given the above circuit schematic and descriptions is well within the ordinary skill in the art and need not be described here.

The above descriptions and drawings disclose illustrative embodiments of the invention. Given the benefit of this disclosure, those skilled in the art will appreciate that various modifications, alternate constructions, and equivalents may also be employed to achieve the advantages of the invention. For example, those skilled in the art will recognize that other transistor configurations may be employed that provide equivalent switching functions. Moreover, although illustrated here with npn bipolar transistors and the terminology appropriate to npn transistors is used in this specification and in the claims, the circuit arrangement may be implemented equivalently with pnp transistors and field effect transistors, as will readily be appreciated by those skilled in the art. Therefore, the invention is not to be limited to the above description and illustrations, but is defined by the appended claims.

What is claimed is:

1. A circuit arrangement for use in an occupancy detector for protection against false triggering, the occupancy detector providing an intermediate signal indicating detection of a target object and including an output stage receiving said intermediate signal and providing a trigger signal in response thereto for energizing a load in response to the detection of said target object, said circuit arrangement comprising:

a first RC network having a first characteristic charge decay time, said first RC network being coupled to said output stage such that said first characteristic charge decay time governs the duration for which said output stage asserts said trigger signal and thereby governs the duration for which said load is energized;

a second RC network having a second characteristic charge decay time, said second RC network being coupled to said output stage to charge when said output stage asserts said trigger signal and to discharge when said output stage deasserts said trigger signal;

a first transistor switch for applying said intermediate signal to said output stage, said first transistor switch being operative upon assertion of said intermediate signal to charge said first RC network;

circuit means defining a bypass path for said intermediate signal bypassing said output stage; and a second transistor switch, operative upon deassertion of said trigger signal for a duration governed by said second characteristic charge decay time, for deactivating said first transistor switch and for diverting said intermediate signal to said bypass path;

whereby any false intermediate signals generated upon deassertion of said trigger signal when said second transistor switch is operative will be diverted to said bypass path.

2. The circuit arrangement of claim 1 wherein said first and second transistor switches comprise first and second transistors, respectively, said second transistor being connected to cut off said first transistor upon deassertion of said trigger signal for the duration governed by said second characteristic charge decay time, and said first transistor being connected to apply said intermediate signal to said first RC network when not cut off by said second transistor.

3. The circuit arrangement of claim 2 wherein said first transistor has a first emitter, a first collector and a first base, said first transistor being connected to receive said intermediate signal at said first collector and at said first base, and being connected to said first RC network at said first emitter, and being biased, when said second transistor switch is inoperative, to pass said intermediate signal to said first RC network; and said second transistor has a second emitter, a second collector and a second base, said second transistor being connected to receive said intermediate signal at said second collector and being connected to said first base of said first transistor at said second collector, and being biased at said second base by said second RC network to connect said intermediate signal to ground for the duration governed by said second characteristic charge decay time.

4. The circuit arrangement of claim 1, further comprising a diode, wherein said second RC network comprises a capacitor connected to said output stage through said diode to charge when said trigger signal is asserted, said capacitor being further connected to discharge through said second transistor switch for forward biasing said second transistor switch when said trigger signal is deasserted.

5. A circuit arrangement for use in an occupancy detector for protection against false triggering, the occupancy detector providing an intermediate signal indicating detection of a target object and including an output stage receiving said intermediate signal and providing a trigger signal in response thereto for energizing a load in response to the detection of said target object, said circuit arrangement comprising:

a first RC network having a first characteristic charge decay time, said first RC network being coupled to said output stage such that said first characteristic charge decay time governs the duration for which said output stage asserts said trigger signal and thereby governs the duration for which said load is energized;

a first transistor having a first emitter, first collector and first base, connected to receive said intermediate signal at said first collector and at said first base and connected at said first emitter to said first RC network;

a first resistive network connected to said first base whereby said first base receives said intermediate signal at a lower potential than said first collector;

a second transistor having a second emitter, second collector and second base, said second collector being connected to bias said first base and being further connected in series with said first resistive network, said second emitter being connected to the output of said output stage;

a second RC network having a second characteristic charge decay time, said second RC network including a capacitor connected to be charged by assertion of said trigger signal and being connected to discharge through said second base; and a diode connected between said second RC network and the common output of said output stage and said second emitter to be reverse biased upon discharge of said second RC network;

whereby said second RC network charges upon assertion of said trigger signal and discharges upon deassertion of said trigger signal, said discharging second RC network biases said second transistor to cut off said first transistor for the duration of said second characteristic charge decay time, and any false intermediate signals generated in the interim being diverted through said first resistive network.

6. A method for protecting an occupancy detector against false triggering, the occupancy detector including occupancy-detecting circuitry providing an intermediate signal indicating detection of a target object and including an output stage receiving said intermediate signal and providing a trigger signal in response thereto for energizing a load in response to the detection of said target object, the occupancy detector further including a first RC network, having a first characteristic charge decay time, coupled to said output stage such that said first characteristic charge decay time governs the duration for which said output stage asserts said trigger signal and thereby governs the duration for which said load is energized, said method comprising the steps of:

applying the output of said occupancy-detecting circuit to said first RC network through a first transistor switch;

biasing said first transistor switch to pass said intermediate signal upon assertion of said intermediate signal;

applying said trigger signal to charge a second RC network, said second RC network having a second characteristic charge decay time;

discharging said second RC network through a second transistor switch when said output stage deasserts said trigger signal for biasing said second transistor switch;

connecting said second transistor switch to cause, when biased by discharging said second RC network, said first transistor switch to be cut off and said output of said occupancy-detection circuitry to be diverted from said first RC network, whereby said first RC network is blocked from receiving the output of said occupancy-detecting circuitry for the duration of said second characteristic charge decay time.

\* \* \* \* \*